(12) United States Patent
Schüssler et al.

(10) Patent No.: US 7,479,189 B2
(45) Date of Patent: Jan. 20, 2009

(54) COATING PLANT WITH A CHARGING LOCK AND DEVICE THEREFOR

(75) Inventors: Uwe Schüssler, Aschaffenburg (DE); Stefan Bangert, Steinau (DE); Jürgen Henrich, Limeshain (DE)

(73) Assignee: Applied Films GmbH & Co. KG, Alzenau (DE)

( * ) Notice: Subject to any disclaimer, the term of this patent is extended or adjusted under 35 U.S.C. 154(b) by 244 days.

(21) Appl. No.: 10/547,718

(22) PCT Filed: Mar. 11, 2004

(86) PCT No.: PCT/EP2004/002542

§ 371 (c)(1),
(2), (4) Date: Aug. 31, 2005

(87) PCT Pub. No.: WO2005/064038

PCT Pub. Date: Jul. 14, 2005

(65) Prior Publication Data

US 2006/0162659 A1    Jul. 27, 2006

(30) Foreign Application Priority Data

Dec. 22, 2003    (WO) .................. PCT/EP03/14749

(51) Int. Cl.
*B05C 15/00* (2006.01)

(52) U.S. Cl. ........................... 118/50; 118/64

(58) Field of Classification Search ............ 118/50, 118/64; 232/15; 414/217; 70/77, 78
See application file for complete search history.

(56) References Cited

U.S. PATENT DOCUMENTS

| 3,397,489 A | | 8/1968 | Cook |
| 3,837,566 A | * | 9/1974 | McGough .................. 232/15 |
| 5,752,796 A | | 5/1998 | Muka |
| 6,074,154 A | * | 6/2000 | Ueda et al. ................. 414/217 |
| 6,123,494 A | * | 9/2000 | Henrich et al. ............. 414/217 |

FOREIGN PATENT DOCUMENTS

DE    29706556    7/1997

* cited by examiner

*Primary Examiner*—Laura Edwards
(74) *Attorney, Agent, or Firm*—Price, Heneveld, Cooper, DeWitt & Litton, LLP

(57) ABSTRACT

The present invention relates to a coating plant, especially a vacuum coating plant, with a charging lock, especially a rectangular vacuum lock for a coating chamber, with a lock aperture (13) having a length of at least 1000 mm that comprises a shutter (6) for closing and opening the lock aperture and a latch (7) to secure the shutter, wherein there are provided means for moving the shutter and the latch from a first open position to a second closed position, and vice versa, these means assuring also that the movements of the shutter (6) and the latch (7) will be coupled with each other in such manner that the shutter (6) will be automatically secured by the latch (7) after the shutter has been closed and will be released again before it is opened.

25 Claims, 9 Drawing Sheets

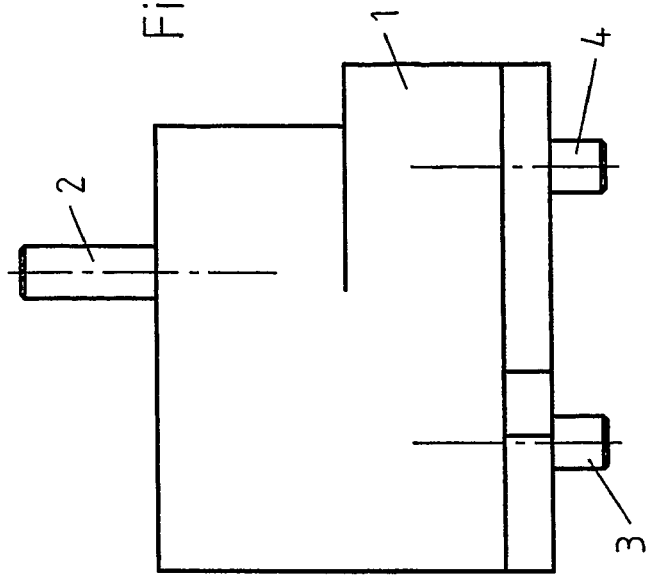
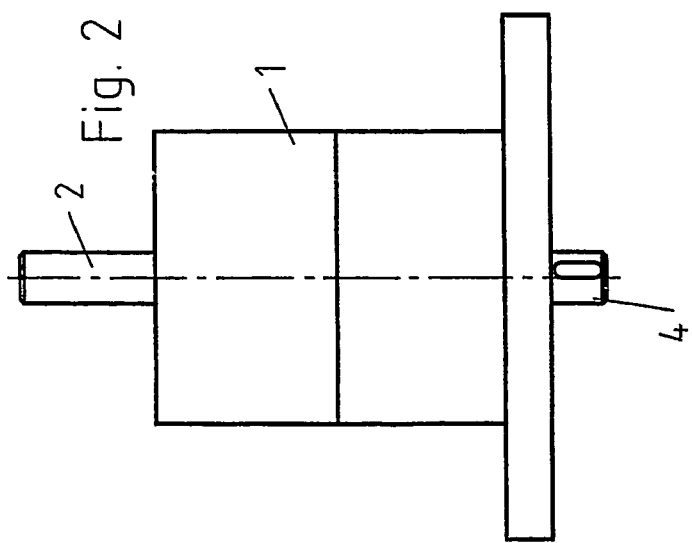
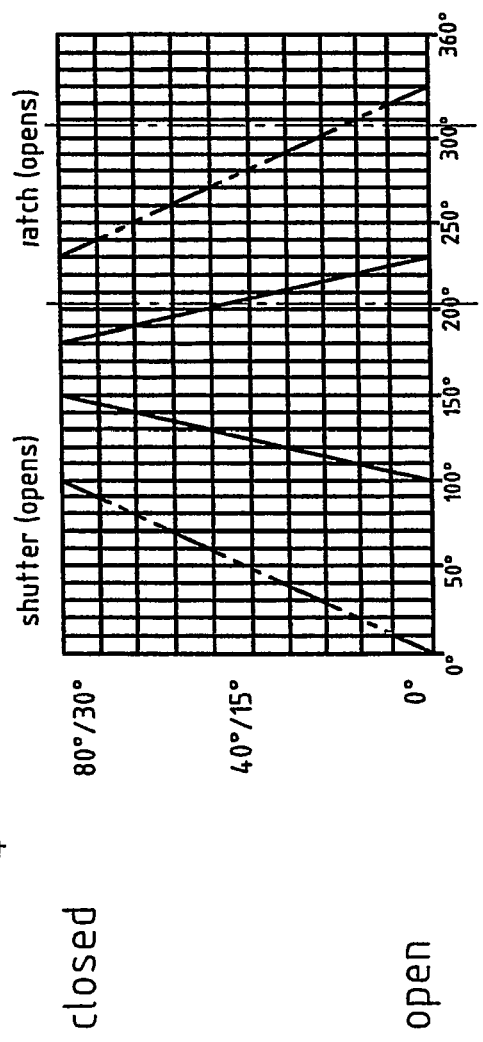

COATING PLANT WITH A CHARGING LOCK AND DEVICE THEREFOR

CROSS-REFERENCE TO RELATED APPLICATION

This application claims priority to International Application No. PCT/EP03/14749 filed on Dec. 22, 2003.

FIELD OF THE INVENTION

The present invention relates to a coating plant, especially a vacuum coating plant, preferably for the coating of substrates with large surface areas, such as-for instance-facade glazing, with a charging lock, especially a rectangular vacuum lock with a lock aperture having a length of at least 1000 mm and over, as well as an appropriate device for opening and closing the lock aperture.

BACKGROUND OF THE INVENTION

Coating plants that are operated under vacuum or near-vacuum conditions make use of charging locks, for example, for the transfer of the substrates into and out of the reaction chamber or the coating chamber. For this purpose there are known rectangular vacuum locks with rectangular lock shutters or lock disks that have a length of 1000 to 1500 mm and a width of about 50 mm. With a view to assuring tight and, especially, gastight closure of the lock aperture, it is the normal practice to secure the lock shutter or the lock disk with a latch that will maintain the shutter or the lock disk in the closed position. Due to the size of the lock aperture, the pressure differences between atmospheric conditions on the one hand and vacuum conditions on the other will give rise to substantial forces that have to be absorbed by the device for the closure of the lock aperture while yet maintaining the gastight closure of the lock.

At the same time, however, the transfer of the substrates through the lock affects the cycle times for the coating in the coating plants. It is therefore necessary for the lock apertures of the lock to be opened and closed quickly in order to save time for the opening and closing steps, because the evacuation or venting of the lock and/or the coating chamber cannot be started unless and until the appropriate apertures are closed in a tight and especially a gastight manner.

SUMMARY OF THE INVENTION

It is therefore an object of the present invention to make available a coating plant and/or an appropriate device for a lock that will render possible a quick closure and opening of the lock, especially a vacuum lock and/or a rectangular vacuum lock of the size in question.

Another object of the present invention is to create a device that will have a long useful life and prove insensitive to environmental influences, thereby assuring safe and reliable operation of the lock. Over and above this, the device should be simple in structure and simple to operate.

The present invention is based on the idea that the opening and the closure of a lock can be accelerated if it becomes possible to do without all the sensors and time-consuming control steps for monitoring and controlling the movements of the lock shutter and/or the lock disks, thereby avoiding the idle times that have to be allowed for between the independent movements of the shutter and the latch. The inventors realized that the opening and closing process of the shutter and the associated step of securing and releasing the shutter by means of the latch can be optimized when the two movements are automatically coupled or combined with each other, especially when they are both mechanically forced and controlled in the sense of a positive movement.

Accordingly, in a preferred embodiment, the combined or coupled movement of the shutter and the latch can be obtained in a simple manner when the shutter performs a rotation or swivel movement during the opening or closure of the lock. Over and above this, the latch may perform rotation or swivel movement or a translation or lifting (vertical) movement when the movements of the shutter and the latch are combined and/or coupled with each other. A rotation or swivel movement of the latch is nevertheless also preferred.

Preferably, use may be made of a transmission gear, especially a cam drive, preferably a swinging cam drive or a turning-lifting gear, in order to produce the combined or coupled movements of the shutter and the latch.

According to an embodiment of the present invention, the transmission gear may comprise a drive shaft to connect it with a drive or motor and two driven shafts of which the movements depend on each other and are therefore coupled. With a view to avoiding mutual interference between shutter and latch during their combined movements, the movements of the shutter and the latch may be separated by a time shift, so that during the closure phase the shutter begins to move while the latch is as yet standing still, and vice versa during the opening process. In this way it is not necessary to have recourse to any special constructive measures for the shutter or the latch or for the movement paths of these elements in order to avoid their interfering with each other during their movements.

For the same reason, it is preferred to provide the shutter with its axis of rotation on one side of the lock aperture that is to be closed, while the latch with its axis of rotation is provided on the opposite side of the opening.

With a view to assuring safe and reliable operation of the device in accordance with the invention, the device may be designed in such a manner that the means that move both the shutter and the latch, especially the transmission, are self-restraining or self-locking. This means that no turning moments or forces are needed in order to maintain the device in its closed position. Consequently, the sealing function of the lock can be maintained even when the energy supply for the device or the drive becomes interrupted. In particular, it is likewise advantageous when the closure device consisting of the shutter and the latch is designed in such a manner that the pressure load can be applied from both sides of the aperture, so that the pressure difference between the different sides of the aperture does not have to be used for making a contribution to the tight closure of the lock.

According to another embodiment of the present invention, the shutter comprises at least a flap holder and a sealing element that fits into the sealing seating of the aperture that is to be closed. Preferably, the sealing element will be arranged, especially elastically pre-tensioned or supported, in such a manner as to enable it to move with respect to the flap holder, thereby making it possible to obtain a tight and especially a gas-tight sealing of the opening by virtue of the sealing element of the shutter being pressed against the sealing seating of the lock aperture.

This can be obtained by providing a spring arrangement to assure an elastic support (bearing) of the sealing element on the flap holder, so that the latch in its closure position will press the flap holder and therefore the shutter into the aperture against the force of the spring.

It is likewise advantageous to provide means for centering the sealing element in relation to the sealing seating of the lock aperture, so that the sealing element will always automatically assume its correct position in relation to the sealing seating.

According to a preferred embodiment, the sealing element is provided with a centering part that has a conical or tapering form projecting from the surrounding sealing surface and extending into the lock aperture that is to be closed by the sealing element in its closed position.

A long useful life of the device can be obtained by arranging the axis of rotation of the shutter in the same plane as the sealing seating of the lock aperture and the sealing surface of the shutter. This minimizes any relative movement of the shutter with respect to the sealing seating and therefore also with respect to such sealing components as O-rings, etc., that are arranged in the sealing seating or the sealing surface of the shutter, so that the useful life is lengthened.

A lengthening of the useful life can also be obtained by designing the spring arrangement by means of which the sealing element is elastically supported on the flap holder in such a manner as to assure that the sealing element will always bear in as parallel as possible a manner against the sealing seating that surrounds the lock aperture. In particular, a staggered arrangement of parallel bar springs can prevent the sealing element from bearing against the lock aperture at an angle or becoming jammed in it. For example, the elastic support by means of the spring element on the side of the lock shutter that during the swivel movement first reaches the opening may be chosen in such a manner as to compensate and/or prevent the higher pressure load deriving from the fact that the shutter is beginning to bear against the opening.

A longer useful life of the device due to an interlock between the latch and the shutter that causes only little friction and/or wear can be obtained by either adapting the shape of the latch to the shutter, or vice versa, or providing appropriate means of assuring an easy interlock or contacting of latch and shutter, roller elements or similar being a case in point.

Further advantages, characteristics and features of the present invention will be brought out more clearly by the following detailed description of a preferred embodiment thereof, said description making reference to the attached drawings.

BRIEF DESCRIPTION OF THE DRAWINGS

The drawings, all of which are purely schematic, show:

FIG. 1 is a lateral view of a transmission gear of the device in accordance with the invention;

FIG. 2 is a lateral view of the transmission gear of FIG. 1 rotated through 90°;

FIG. 3 is a movement diagram for the shutter and the latch in accordance with the preferred embodiment of the invention;

DETAILED DESCRIPTION OF THE PREFERRED EMBODIMENTS

Figure 4:
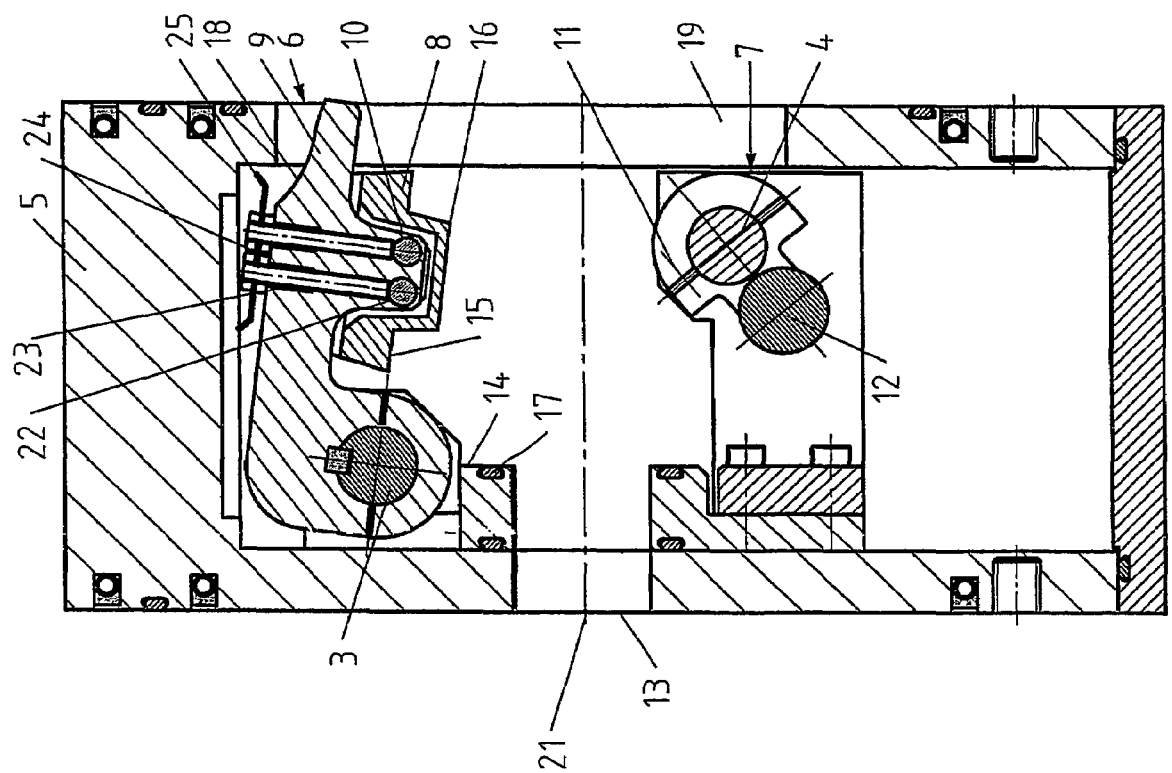
FIG. 4 shows a cross section through a housing in which the shutter and the latch are arranged.
Figure 5:
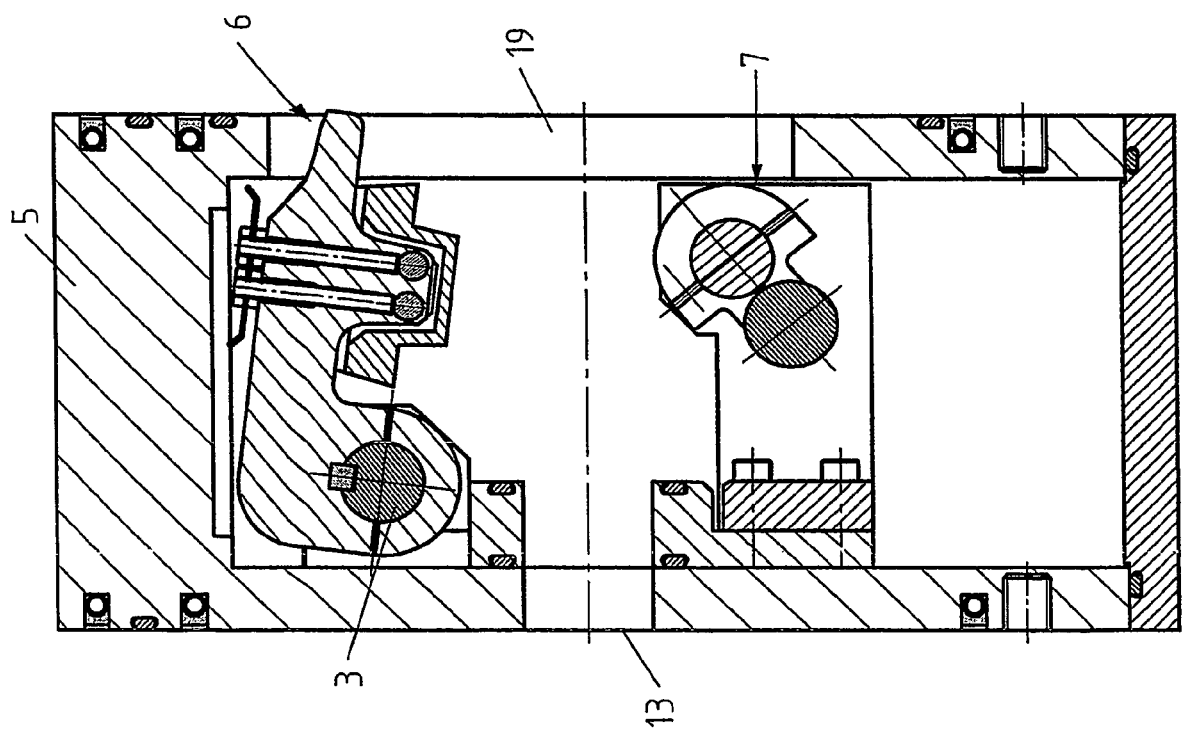
FIG. 5 shows a cross section through the embodiment in accordance with FIG. 4 in a first position during the closure and the opening of the lock.

FIG. 1 shows a lateral view of a transmission gear, especially a reciprocating or swinging cam drive, with one driving shaft 2 and two driven shafts 3 and 4, the latter performing an interdependent movement. While the driving shaft 2 is effectively connected to a drive, an electric motor for example, the driven shafts are connected for operating purposes to the shutter 6 and the latch 7 of the lock (see FIG. 4). Accordingly, both the driving shaft 2 and the driven shafts 3 and 4 comprise coupling means to connect them to the drive, the shutter 6 and the latch 7, as can best be seen, for example, in FIG. 2 for the shaft 4.

The transmission gear couples the driven shafts 3 and 4 to each other in such a manner that both the shafts 3 and 4 will be automatically rotated or swiveled when the driving shaft 2 is driven by means of a drive or motor. In particular, the coupled movement of the shafts 3 and 4 is phase-staggered, as can be seen from the motion diagram of FIG. 3. Accordingly, the shaft 3, which is connected to the shutter 6 (FIG. 4), is first moved from a first open position in the direction of a second closed position, while the latch 7 (see FIG. 4), which secures the shutter 6 in the closed position, remains at first in the open position. Following a predetermined movement of the shutter 6 or the shaft 3, the shaft 4 likewise begins to rotate in order to move the latch into its closed position. Due to the phase shift between the movements of the shaft 3 and the shaft 4 and/or the shutter 6 and the latch 7, the shutter 6 will be the first to reach the second closed position, thus making it possible for the latch to secure the closed position.

The transmission gear is designed in such a manner that the shutter 6 and the latch 7 are driven during the opening in reverse sequence. In this case, the latch 7 begins to swivel in the direction of the open position, while the shutter 6 remains in the closed position for a certain period of time. When the latch 7 has rotated to a point where the shutter 6 is released, the shutter 6 likewise begins to rotate due to the swiveling of the shaft 3. Since mechanical structure of the reciprocating or swinging cam drive is such as to make it always follow the same curve, the driven shafts 3 and 4 are mechanically controlled and always perform the same repetitive movement, so that there can be no collision between the shutter 6 and the latch 7. In particular, the reciprocating cam drive is also designed in such a manner that the driving shaft 2 can only be rotated in one direction and the driven shafts 3 and 4, in accordance with the given pattern, pass through closure of the shutter and securing of the shutter by means of the latch and also release of the shutter and opening of the shutter. Due to the cam drive, however, it is also possible for the driving shaft to be rotated to and fro, i.e., for it to be moved in opposite directions, during opening and closure. In this case, once again, the controlled movement of the driven shafts 3 and 4 assures a corresponding movement of the shutter 6 and the latch 7 for the opening and closing of the lock aperture.

As can best be seen from the cross section of FIG. 4, the shutter 6 and the latch 7 are accommodated within a housing that can be arranged in a gastight manner in a lock, especially a vacuum lock or a reaction or coating chamber of a coating plant. The housing 5 comprises opposite apertures 13 and 19, of which the aperture 13 is the one that can be closed by means of the shutter 6. Due to the self-restraining structure of the closure mechanism with the shutter 6 and the latch 7, which will be described in greater detail further on, both sides of the aperture 13 may become subject to greater pressure than the separate space lying on the other, because the closure device is not being maintained in its closed position by the pressure difference. Consequently, the housing 5 with the closure device is suitable for universal use: for example, atmospheric conditions may prevail to the left of the aperture 13 of FIG. 4 and vacuum conditions to the right thereof, and vice versa.

The shutter 6 comprises at least one flap holder 9 that is attached to the driving shaft 3, as well as a sealing element 8 to provide an airtight seal of the aperture 13 when in the closed position. Since the lock aperture 13 is preferably rectangular in shape, with its longitudinal axis arranged at right angles to the plane of FIG. 4, and, given a width of 50 mm, extends over a length of at least 1000 mm, preferably more than 1500 mm and, even more preferably 1800 to 2000 mm, the sealing element 8 should preferably be provided likewise as a single piece of these dimensions. It will therefore be advantageous to provide several flap holders 9 distributed over the length of the sealing element 8.

The sealing element 8 comprises a sealing surface 15 and a centering part 16 of conical or tapering shape that projects from the surrounding sealing surface 15.

Figure 6:
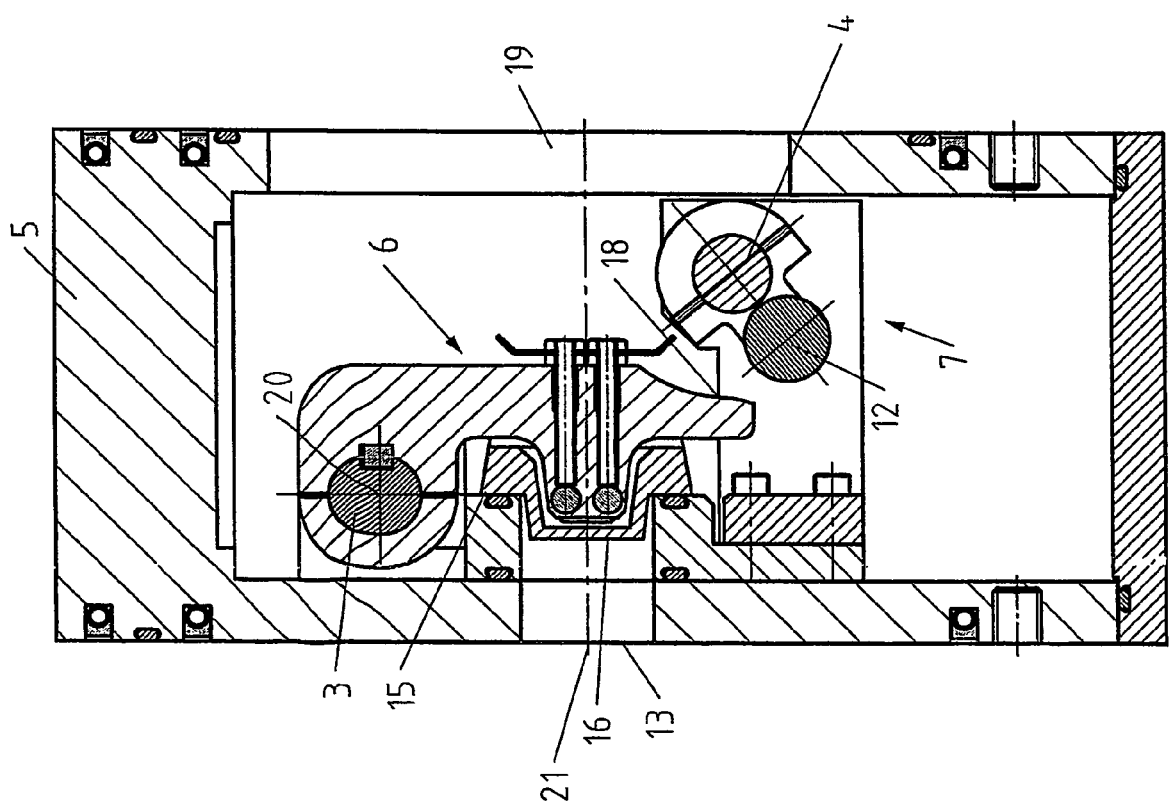
FIG. 6 shows a cross section through the embodiment in accordance with FIG. 4 in a second position during the closure and the opening of the lock.
Figure 7:
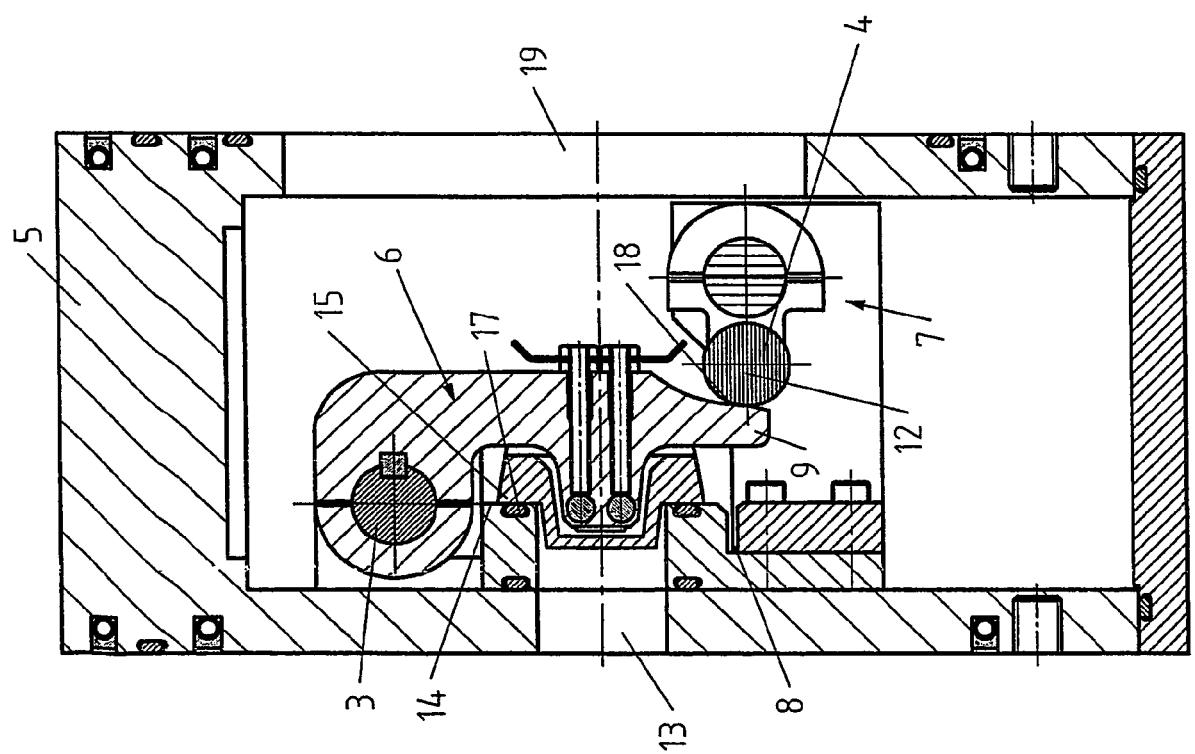
FIG. 7 shows a cross section through the embodiment in accordance with FIG. 4 in a third position during the closure and the opening of the lock.

As can best be seen from FIG. 6, in the closed position the centering part of the sealing element 8 extends into the lock aperture, while the sealing surface 15 is in contact with the sealing seating 14 that surrounds the lock aperture 13. In this way, the sealing surface 15 of the sealing element 8 of the shutter 6 comes into contact with the O-ring 17 of the sealing seating 14 of the lock aperture 13 and thus seals the lock aperture 13 in a gastight manner when in the closed position.

As can likewise be best seen from FIG. 4, the axis of rotation 20 of the driving shaft 3 is provided in the plane of the sealing seating 14 of the lock aperture 13 and the sealing surface 15 of the sealing element 18 of the shutter 6. Accordingly, when the shutter is being closed, the sealing element is made to approach the sealing seating 14 and/or the sealing rings 17 in such a manner as to bring it into contact with the sealing seating 14 and/or the sealing rings 17, but without a subsequent swiveling or rotatory movement. In particular, this arrangement assures that when the shutter 6 and/or the sealing surface 15 makes contact with the sealing seating 14 of the aperture 13, this will not be followed either by jamming or by a walking movement with respect to the sealing rings 17. Rather, there can only be a parallel contact between the shutter 6 and/or the sealing surface 15 of the shutter 6 on both sides of the aperture 13. Consequently, loading or stressing of the sealing ring 17 due to a movement with respect to the sealing ring is minimized, so that the useful life of the sealing ring is improved.

This is assured by the manner in which the sealing element 8 is arranged on the flap holder 9, which will now be described. As is shown by the cross section of FIG. 4, the sealing element is mounted on the flap holder 9 in a mobile manner by means of a spring arrangement 10 consisting preferably of bar springs. The sealing element 8 can therefore be moved in the direction of the flap holder 9, i.e., parallel to the axis 21 of the aperture 13 when in the closed position. Consequently, the sealing element 8 can be elastically pressed against the sealing seating 14 by applying pressure to the flap holder 9. When in the closed position, the pressure on the flap holder 9 is applied by means of the latch 7, as is shown particularly well by FIG. 8.

As can be seen from FIGS. 4 to 8, the spring arrangement 10 comprises two bar springs 22 that are arranged parallel to each other and also parallel to the longitudinal direction of the lock aperture 13, i.e., at right angles to the plane of the figure. The ends of the bar springs 22 extend into the sealing element 8, while locking pins 23 situated in their central region maintain them in position and press and/or pretension them in the direction of the aperture 13 (when in the closed position). The pre-tensioning may however be so small that only the bar springs 22 will be maintained in position and no other elastic stresses are brought into being. The locking pins 23 may be secured by means of an appropriate mounting part 24 at their end lying opposite the bar springs, where the mounting part 24 is preferably such as to comprise the possibility of setting the pre-tensioning of the bar springs 22. A heat shield 25 may also be provided on the mounting part 24. A holding screw may of course be used in place of the locking pins and the single spring arrangement 10 could be substituted by several spring arrangements distributed over the length of the sealing element 8.

Preferably, the bar springs 22 are arranged so as to be staggered sideways (not shown) and/or to be differently tensioned by the locking pins 23, thereby assuring as parallel as possible a contact between the between the sealing element 8 and the sealing seating 14.

The latch 7 comprises a clamp 11 by means of which the latch 7 is attached to the driven shaft 4 of the cam drive 1. Preferably, several latches will be provided along the driven shaft 4, which extends parallel to the longitudinal axis of the lock aperture 13.

Figure 8:
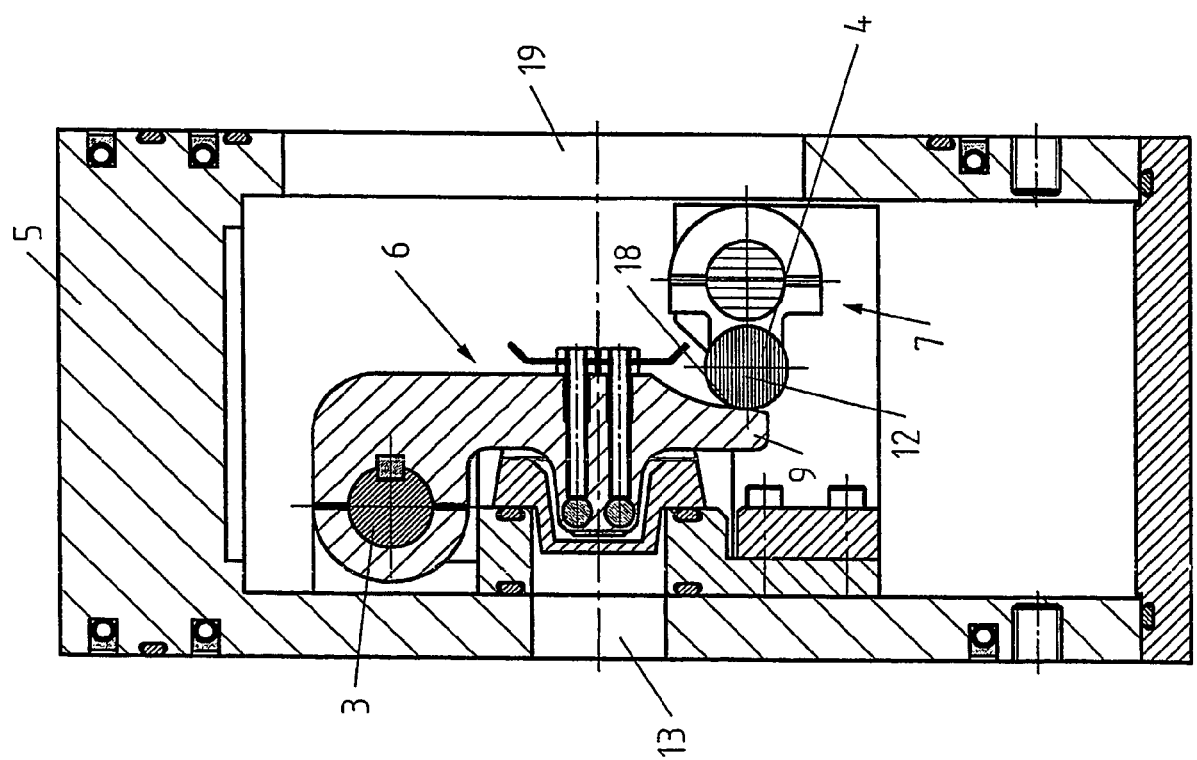
FIG. 8 shows a cross section through the embodiment in accordance with FIG. 4 in a fourth position during the closure and the opening of the lock.
Figure 9:
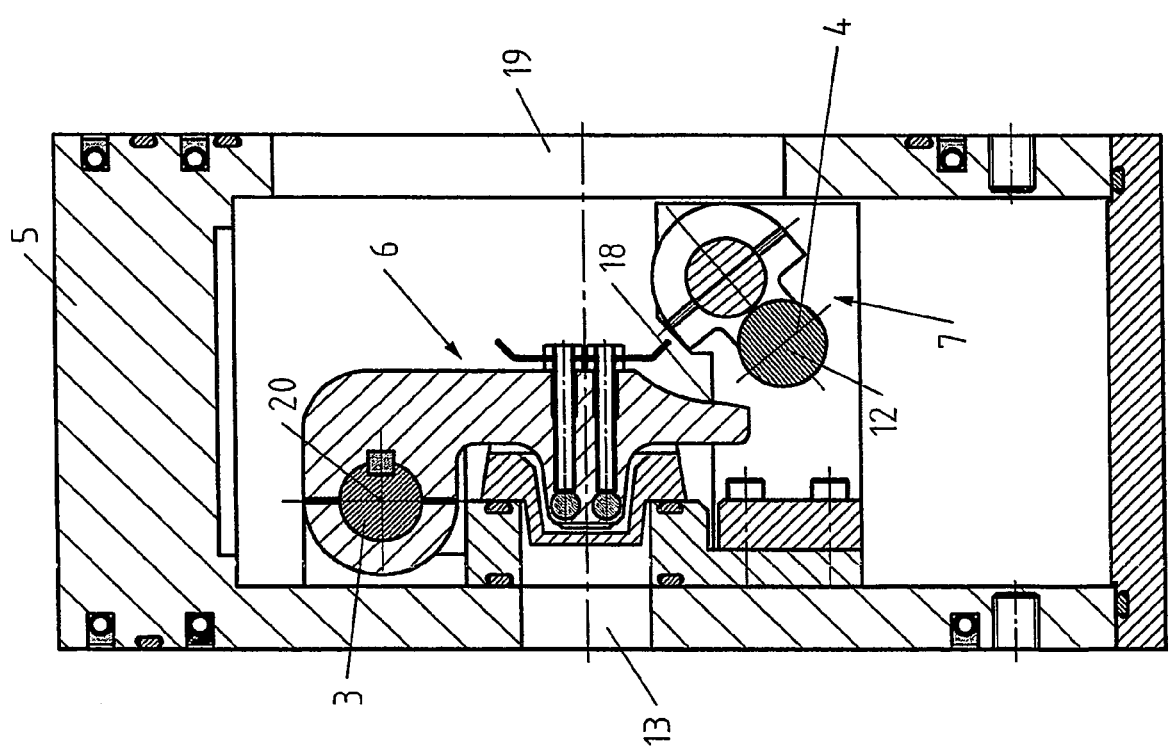
FIG. 9 shows a cross section through the embodiment in accordance with FIG. 4 in a fifth position during the closure and the opening of the lock.

On one side of the clamp 11 of the latch 7 there is arranged an engaging element 12 with a curved or ball-shaped form, especially a partly ball-shaped form. When in the closed position, the engaging element 12 engages with the cut-out 18 formed on the flap holder 9 of the shutter 6, as can be seen in FIG. 8. Given the at least partially complementary form of the cut-out 18 and the engaging element 12, the latter can be brought in a simple manner into its ultimate end position, in which the latch 7 secures the shutter 6 in the closed position (see FIG. 7). The design of the shutter 6 and, more particularly, of the cut-out 18 and the engaging element 12 of the latch 7 may be chosen in such a manner that, when the engaging element is engaged with the cut-out 18, the flap holder 9 will be pressed in the direction of the aperture 13, thus pressing the sealing element 8 with the sealing surface 15 against the elastic return force of the spring arrangement 10 against the sealing seating 14 and the sealing ring 17 of the sealing seating 14 and assuring a tight, especially a gastight coverage of the aperture 13.

The device is self-restraining or self-locking when in the closed position, so that it is not necessary to apply any turning moment to the driving shaft 2 or the driven shafts 3 and 4 of the cam drive 1 in order to maintain the device in its closed position. Rather, the fact that the device is secured by the latch 7 assures that, even when the shafts are idle, the closure cannot be opened neither from one side nor the other.

The device in accordance with the present invention that is shown in FIGS. 4 to 9 operates as follows. From the open position, which is shown in FIG. 4, the driving shaft 2 is first driven in order to rotate the shutter 6 via the driven shaft 3 in the direction of the aperture 13, as is indicated by the arrow in FIG. 5. Following a certain movement of the driven shaft 3 and/or the shutter 6, the latch 7 likewise begins to rotate. When the shutter 6 has reached its closed final position, in which the sealing element 8 extends into the sealing seating 14 of the lock aperture 13, the latch 7 swivels in the direction of the shutter 6, thereby making its engaging element 12 engage with the cut-out 18 of the shutter 6 (see FIGS. 6 and 7). When the latch 7 has attained its final position, in which the engaging element 12 is accommodated in the cut-out 18 of the flap holder 9, the flap holder 9 is pressed in the direction of the aperture 13 and, consequently, the sealing element 8 is pressed against the sealing seating 14 of the aperture 13, thus closing the aperture in a gas-tight manner.

When the lock aperture 13 is to be opened, the latch 7 must first be rotated out of the cut-out 18 by means of the driven shaft 4 that, in its turn is driven by the driving shaft 2, thus making it possible for the shutter 6 to be swiveled about the axis of rotation 20 of the driven shaft 3.

Given the coupled movement of the driven shafts 3 and 4 and/or the shutter 6 and the latch 7, it is possible to obtain very brief opening and closure times for the lock aperture, especially in the range from <1 sec in the case of aperture sizes of 50×1000 mm and over. It is therefore possible to obtain very brief operating times for the transfer of, for example, coating substrates through the lock, and this even when the lock aperture and/or the sealing element have a length of at least 1000 mm or more, preferably more than 1500 mm and especially 1800 to 2000 mm, with a width of about 50 mm. Design in accordance with the invention also makes it possible to step up the useful life to cycles of more than $10^6$. Given the mechanically controlled coupled movement of shutter and latch, moreover, there is no need for sensors to supervise the movements of the shutter and the latch.

Figure 10:
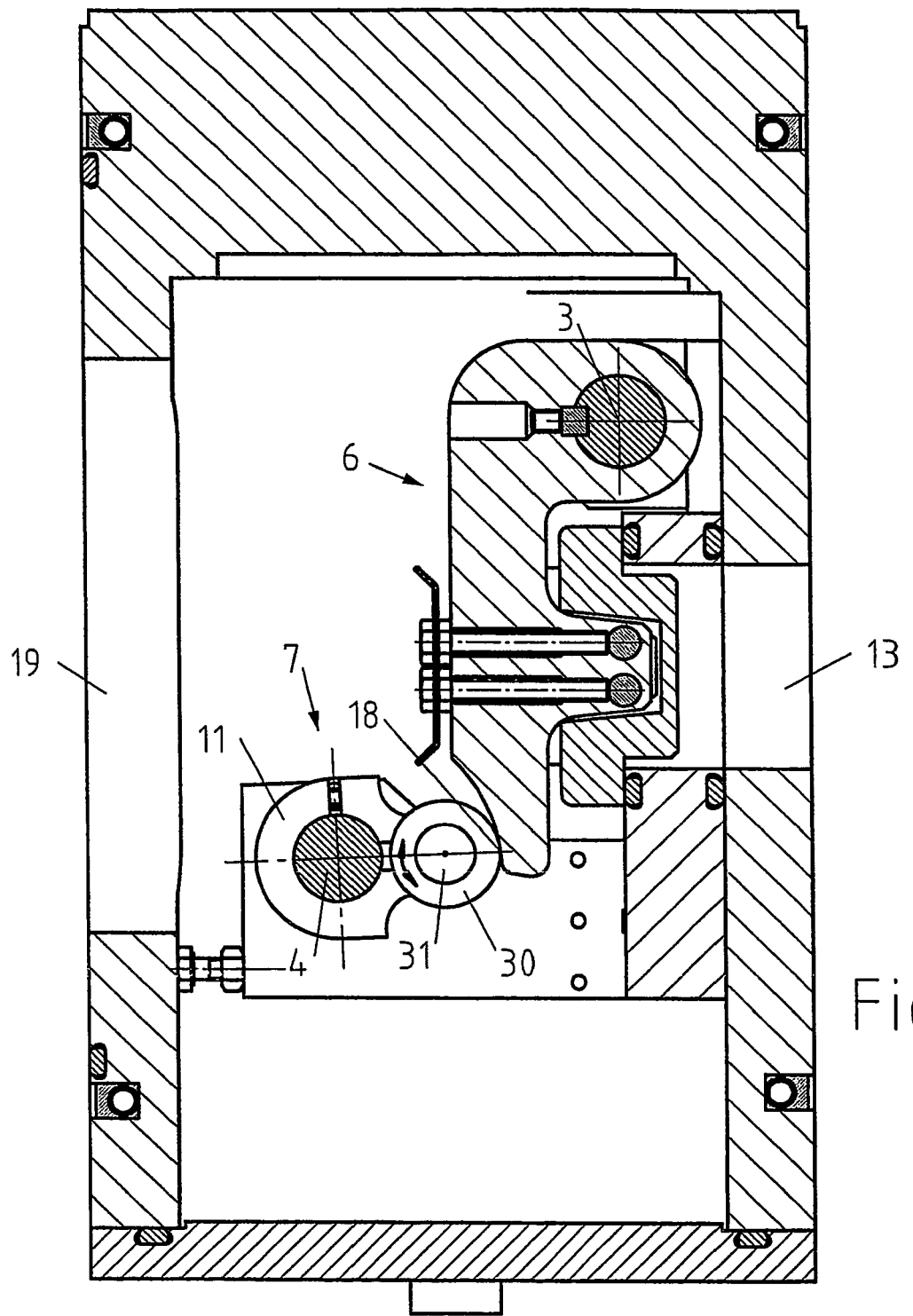
FIG. 10 shows a cross section of another embodiment of a charging lock.

FIG. 10 shows another embodiment of a charging lock according to the invention which is similar to that one shown in FIG. 4. Accordingly, parts being identical are designated by the same referenced numerals and only differences are described herein below.

The latch 7 of the embodiment shown in FIG. 10 also comprises a clamp 11 by means of which the latch 7 is attached to the driven shaft 4 of the cam drive.

Instead of stationary engaging element 12 with a curved, cylindrical or ball-shaped form, a roller 30 is provided for which is rotatably supported on shaft 31, the axis of rotation of which is parallel to the driven shaft 4. Accordingly, engagement of the engaging element 12 with the cut-out 18 of the shutter 6 can be carried out in a very smooth and gentle way.

Figure 11:
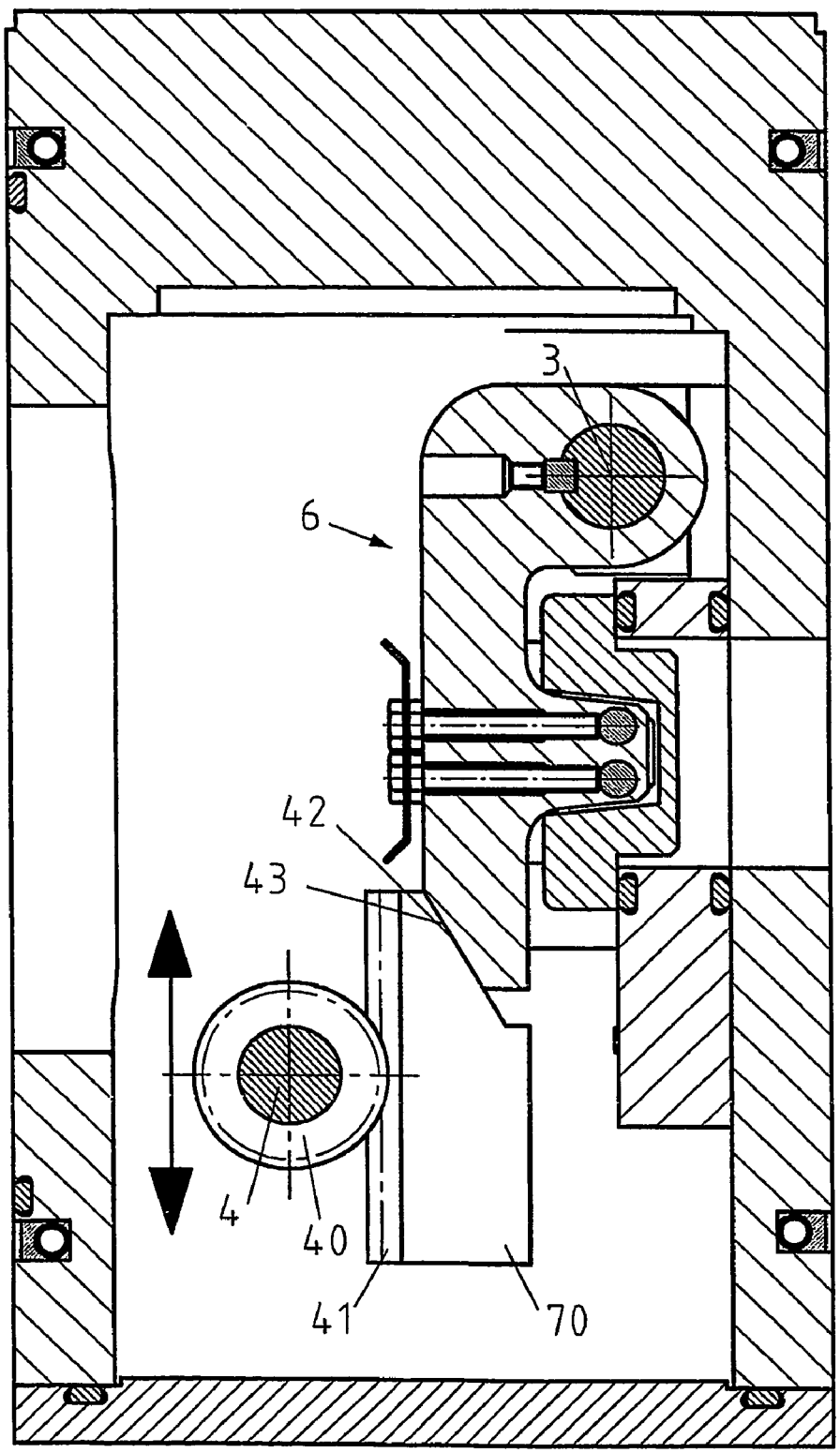
FIG. 11 shows a cross section of still another embodiment of a charging lock.

The third embodiment of the charging lock shown in FIG. 11 differs with respect to the embodiments described before in the design of the latch 7. Instead of the rotatable latch 7 of the previous embodiments swiveling between an engaging position and an open position, a relocatable or shiftable latch 70 carrying out a translational movement between the engaging position and an open position is provided for. Accordingly, instead of the cut out 18, an angular face 42 is disposed at the shutter 6. The latch 70 comprises a corresponding angular face 43 being in contact with the angular face 42 of the shutter 6 in the closed or secured position.

In order to open the charging lock, the latch 70 carries out a translational movement according to the arrow shown in FIG. 11.

The latch 70 is driven by the driven shaft 4 comprising a driving ring or gear wheel 40 engaging with the contact surface or gear rack 41.

The invention claimed is:

1. A coating plant for coating substrates with particularly large surface areas comprising:
   a coating chamber configured to accommodate the substrate during the coating;
   at least one charging lock through which the substrate is introduced into the coating chamber and/or removed from the coating chamber, the lock comprising an aperture that can be closed by a shutter, the shutter being securable by at least one latch; and
   a drive mechanism for moving both the shutter and the latch from a first open position to a second closed position, wherein movements of the shutter and the latch are coupled with each other, so that the movement of the shutter and the latch causes the shutter automatically to be secured by the latch after the closing of the shutter, and so that the movement of the shutter and the latch causes the latch automatically to free the shutter before the opening of the shutter.

2. A coating device in accordance with claim 1, wherein: the movements of the shutter and the latch are mechanically controlled movements.

3. A coating device in accordance with claim 1, wherein: the movement of the shutter is a rotation movement and the movement of the latch is a rotation movement.

4. A coating device in accordance with claim 1, wherein: the movement of the shutter is a rotation movement and the movement of the latch is a translation movement.

5. A coating device in accordance with claim 1, wherein: the movement of the shutter and the movement of the latch are phase-staggered.

6. A coating device in accordance with claim 5, wherein: the movement of the latch is retarded relative to the movement of the shutter during closure and precedes the movement of the shutter during opening.

7. A coating device in accordance with claim 1, wherein: both the shutter and the latch each include a respective axis of rotation, the axes of rotation of the shutter and the latch being provided on opposite sides of the aperture of the lock.

8. A coating device in accordance with claim 1, wherein: the drive mechanism for moving the shutter and the latch comprises a self-locking device.

9. A coating device in accordance with claim 1, wherein: the shutter and the latch each include a respective engaging surface that are designed to be substantially complementary to each other, thus making it possible for them to become engaged with each other very smoothly and with little friction and wear.

10. A coating device in accordance with claim 9, wherein: the engaging surfaces are curved.

11. A coating device in accordance with claim 1, wherein: the latch comprises a roller that is rotatably supported, thus rendering possible a simple contact with the shutter when the shutter is to be secured.

12. A coating device in accordance with claim 1, wherein: the latch presses the shutter against the aperture of the lock when in the second closed position.

13. A coating plant for coating substrates with particularly large surface areas comprising:
   a coating chamber configured to accommodate the substrate during the coating;
   at least one charging lock through which the substrate is introduced into the coating chamber and/or removed from the coating chamber, the lock comprising an aperture that can be closed by a shutter, the shutter being securable by at least one latch; and
   a drive mechanism for moving both the shutter and the latch from a first open position to a second closed position, wherein movements of the shutter and the latch are coupled with each other, so that the shutter will be automatically secured by the latch after the closing of the shutter and released before the opening of the shutter;
   wherein the drive mechanism for moving the shutter and the latch comprises a transmission gear with a driving shaft on a driving side and at least two coupled driven shafts that are connected with the shutter and the latch.

14. A coating device in accordance with claim 13, wherein: the transmission gear is a cam drive.

15. A coating device in accordance with claim 14, wherein: the cam drive is a reciprocating cam drive.

16. A coating device in accordance with claim 14, wherein: the cam drive is a rotation-lifting drive.

17. A coating plant for coating substrates with particularly large surface areas comprising:
- a coating chamber configured to accommodate the substrate during the coating;
- at least one charging lock through which the substrate is introduced into the coating chamber and/or removed from the coating chamber, the lock comprising an aperture that can be closed by a shutter, the shutter being securable by at least one latch; and
- a drive mechanism for moving both the shutter and the latch from a first open position to a second closed position, wherein movements of the shutter and the latch are coupled with each other, so that the shutter will be automatically secured by the latch after the closing of the shutter and released before the opening of the shutter;
- wherein the shutter comprises a flap holder and a sealing element that can extend into and seal a sealing seating of the aperture of the lock; and
- the sealing element is elastically mounted in such a manner as to be mobile with respect to the flap holder.

18. A coating device in accordance with claim 17, wherein: the sealing element is elastically mounted with a spring arrangement.

19. A coating device in accordance with claim 18, wherein: the spring arrangement comprises bar springs.

20. A coating device in accordance with claim 19, wherein:
- the bar springs are orientated parallel to a longitudinal direction of the aperture of the lock and the sealing element; and
- the bar springs are pre-tensioned against the flap holder.

21. A coating device in accordance with claim 20, wherein: the bar springs are pre-tensioned against the flap holder in a direction of the aperture of the lock.

22. A coating device in accordance with claim 17, wherein:
- the sealing element has a sealing side that comprises at least a sealing surface and a centering part that extends into the aperture of the lock; and
- the sealing surface is in contact with a sealing part of the sealing seating of the aperture when in the closed position.

23. A coating device in accordance with claim 22, wherein: the shutter has an axis of rotation that is substantially arranged in a plane of the sealing seating of the aperture of the lock.

24. A coating device in accordance with claim 17, wherein: the sealing element and/or the sealing seating comprise at least one sealing ring.

25. A coating device in accordance with claim 22, wherein:
- the centering part has a tapering shape; and
- the centering part projects from the sealing surface of the shutter.

* * * * *

UNITED STATES PATENT AND TRADEMARK OFFICE
CERTIFICATE OF CORRECTION

| | | |
|---|---|---|
| PATENT NO. | : 7,479,189 B2 | Page 1 of 1 |
| APPLICATION NO. | : 10/547718 | |
| DATED | : January 20, 2009 | |
| INVENTOR(S) | : Uwe Schüssler et al. | |

It is certified that error appears in the above-identified patent and that said Letters Patent is hereby corrected as shown below:

On the Title Pg, Item (73)
Assignee
"Applied Films GmbH & Co. KG" should be --Applied Materials GmbH & Co. KG--.

Column 6
Line 24, delete "between the" (2nd occurrence).

Column 7
Line 31, "referenced" should be --reference--.
Line 37, delete "for."
Line 49, "cut out" should be --cut-out--.

Column 8
Claim 9, line 38, "are" should be --is--.

Signed and Sealed this
Twenty-sixth Day of April, 2011

David J. Kappos
*Director of the United States Patent and Trademark Office*